(12) United States Patent
Kawasaki

(10) Patent No.: US 10,622,964 B2
(45) Date of Patent: Apr. 14, 2020

(54) ELASTIC WAVE DEVICE

(71) Applicant: Murata Manufacturing Co., Ltd., Nagaokakyo-shi, Kyoto-fu (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 323 days.

(21) Appl. No.: 15/413,561

(22) Filed: Jan. 24, 2017

(65) Prior Publication Data

US 2017/0134003 A1 May 11, 2017

Related U.S. Application Data

(63) Continuation of application No. PCT/JP2015/067328, filed on Jun. 16, 2015.

(30) Foreign Application Priority Data

Jul. 28, 2014 (JP) .................................. 2014-152619

(51) Int. Cl.
*H03H 9/02* (2006.01)
*H03H 9/64* (2006.01)
(Continued)

(52) U.S. Cl.
CPC .... *H03H 9/02834* (2013.01); *H03H 9/02944* (2013.01); *H03H 9/02992* (2013.01);
(Continued)

(58) Field of Classification Search
CPC ...... H03H 9/02944; H03H 9/145; H03H 9/17; H03H 9/176; H03H 9/205; H03H 9/56;
(Continued)

(56) References Cited

U.S. PATENT DOCUMENTS 7,659,796 B2 * 2/2010 Funami .................. H03H 9/725
333/133
2008/0204167 A1 8/2008 Takamine
(Continued)

FOREIGN PATENT DOCUMENTS

| JP | 2000-049567 A | 2/2000 |
| JP | 2000-183679 A | 6/2000 |

(Continued)

OTHER PUBLICATIONS

English language machine translation of JP 2000-183679 A (cited by Applicant), published Jun. 30, 2000, 11 pages. (Year: 2000).*
(Continued)

*Primary Examiner* — Barbara Summons
(74) *Attorney, Agent, or Firm* — Keating & Bennett, LLP

(57) ABSTRACT

An elastic wave device includes a piezoelectric substrate, an IDT electrode on the piezoelectric substrate and including first and second busbars and first and second electrode fingers connected to the first and second busbars, a bump electrode electrically connected to the IDT electrode, a protective film covering the IDT electrode, and a heat-conductive material layer that has an insulating property and that is provided only in a region excluding an excitation region of any IDT electrode and a region located above the bump electrode.

14 Claims, 6 Drawing Sheets

(51) Int. Cl.
*H03H 9/145* (2006.01)
*H03H 9/72* (2006.01)

(52) U.S. Cl.
CPC ........ *H03H 9/145* (2013.01); *H03H 9/14541* (2013.01); *H03H 9/6483* (2013.01); *H03H 9/725* (2013.01)

(58) Field of Classification Search
CPC ........ H03H 9/562; H03H 9/64; H03H 9/6483; H03H 9/72; H03H 9/725; H03H 9/02834; H03H 9/02992; H03H 9/14541
USPC .......................................... 333/133, 193–196
See application file for complete search history.

(56) References Cited

U.S. PATENT DOCUMENTS

| | | | | |
|---|---|---|---|---|
| 2013/0187730 | A1* | 7/2013 | Nishizawa | H03H 9/54 333/193ke |
| 2013/0257221 | A1* | 10/2013 | Yamaji | H03H 9/1092 310/313 B |
| 2014/0368296 | A1* | 12/2014 | Nishizawa | H03H 9/725 333/133 |

FOREIGN PATENT DOCUMENTS

| | | | |
|---|---|---|---|
| JP | 2000-196407 A | | 7/2000 |
| JP | 2007-259023 A | | 10/2007 |
| JP | 2008-072771 A | * | 3/2008 |
| JP | 2013-168864 A | | 8/2013 |
| WO | 2007/055077 A1 | | 5/2007 |

OTHER PUBLICATIONS

English language machine translation of JP 2000-049567 A (cited by Applicant), published Feb. 18, 2000, 3 pages. (Year: 2000 ).*
English language machine translation of JP 2000-196407 A (cited by Applicant), published Jul. 14, 2000, 7 pages. (Year: 2000).*
Official Communication issued in corresponding International Application PCT/JP2015/067328, dated Aug. 18, 2015.

* cited by examiner

ELASTIC WAVE DEVICE

CROSS REFERENCE TO RELATED APPLICATIONS

This application claims the benefit of priority to Japanese Patent Application No. 2014-152619 filed on Jul. 28, 2014 and is a Continuation Application of PCT Application No. PCT/JP2015/067328 filed on Jun. 16, 2015. The entire contents of each application are hereby incorporated herein by reference.

BACKGROUND OF THE INVENTION

1. Field of the Invention

The present invention relates to an elastic wave device in which a protective film is provided on a piezoelectric substrate.

2. Description of the Related Art

In the related art, elastic wave devices have been widely used as resonators and band pass filters.

For example, Japanese Unexamined Patent Application Publication No. 2013-168864, which will be described below, discloses an elastic wave device that includes a piezoelectric substrate, interdigital transducer (IDT) electrodes, and a protective film formed so as to cover the IDT electrodes. In Japanese Unexamined Patent Application Publication No. 2013-168864, the protective film can be made of a dielectric material such as alumina or sapphire. In addition, the thickness of the above-mentioned protective film is $0.03\lambda$ to $0.5\lambda$.

In recent years, along with simultaneous utilization of a plurality of bands, such as carrier aggregation, and high-speed communication, such as LTE, the electrical power applied to a filter has been increased. Accordingly, in an elastic wave device such as that described in Japanese Unexamined Patent Application Publication No. 2013-168864, there have been cases where the electrical characteristics vary and where the IDT electrode portion melts, as a result of an IDT electrode portion generating heat.

In this case, by forming a protective film, which is made of a dielectric material having a high thermal conductivity, on the IDT electrode portion, the heat is able to be dissipated. However, in order to sufficiently dissipate the heat, it is necessary to increase the film thickness of the protective film. In the case where the film thickness of the protective film on the IDT electrode is increased, the resonator characteristics may sometimes deteriorate.

SUMMARY OF THE INVENTION

Preferred embodiments of the present invention provide elastic wave devices that have high heat-dissipation performance and whose electrical characteristics such as resonator characteristics are less likely to deteriorate.

An elastic wave device according to a preferred embodiment of the present invention includes a piezoelectric substrate, an IDT electrode that is stacked on the piezoelectric substrate and that includes first and second busbars and first and second electrode fingers connected to the first and second busbars, a mount electrode that is electrically connected to the IDT electrode, a protective film that covers the IDT electrode, and a heat-conductive material layer that has an insulating property and that is defined at least partially by a region excluding an excitation region of the IDT electrode and a region located above the mount electrode.

An elastic wave device according to a preferred embodiment of the present invention further includes a wiring electrode that connects the first and second busbars of the IDT electrode and the mount electrode to each other.

In an elastic wave device according to another preferred embodiment of the present invention, the wiring electrode has a multilayer structure in which two metal layers are stacked one on top of another.

In an elastic wave device according to another preferred embodiment of the present invention, the heat-conductive material layer is in contact with at least a portion of the wiring electrode.

In an elastic wave device according to another preferred embodiment of the present invention, the heat-conductive material layer is stacked on the wiring electrode.

In an elastic wave device according to another preferred embodiment of the present invention, the heat-conductive material layer is interposed between the wiring electrode and the piezoelectric substrate.

In an elastic wave device according to another preferred embodiment of the present invention, the heat-conductive material layer is adjacent to the wiring electrode.

In an elastic wave device according to another preferred embodiment of the present invention, the heat-conductive material layer is connected to the mount electrode.

In an elastic wave device according to another preferred embodiment of the present invention, the heat-conductive material layer has a thickness larger than a thickness of the protective film.

In an elastic wave device according to another preferred embodiment of the present invention, the protective film includes at least one of $SiO_2$ and SiN.

In an elastic wave device according to another preferred embodiment of the present invention, the heat-conductive material layer includes at least one type of dielectric material selected from a group consisting of alumina, sapphire, aluminum nitride, diamond, aluminum nitride doped with scandium, $SiO_2$, and SiN.

In an elastic wave device according to another preferred embodiment of the present invention, a ladder-type filter circuit is provided.

In an elastic wave device according to another preferred embodiment of the present invention, the heat-conductive material layer connects, to the mount electrode, a serial arm resonator of the ladder-type filter circuit excluding a resonator connected to the mount electrode.

According to various preferred embodiments of the present invention, since the heat-conductive material layer having an insulating property is provided only in a region excluding regions located above the first and second electrode fingers of any IDT electrodes and the mount electrode, an elastic wave device that has high heat-dissipation performance and in which deterioration in the electrical characteristics, such as the resonator characteristics, are less likely to occur, is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

Figure 1:
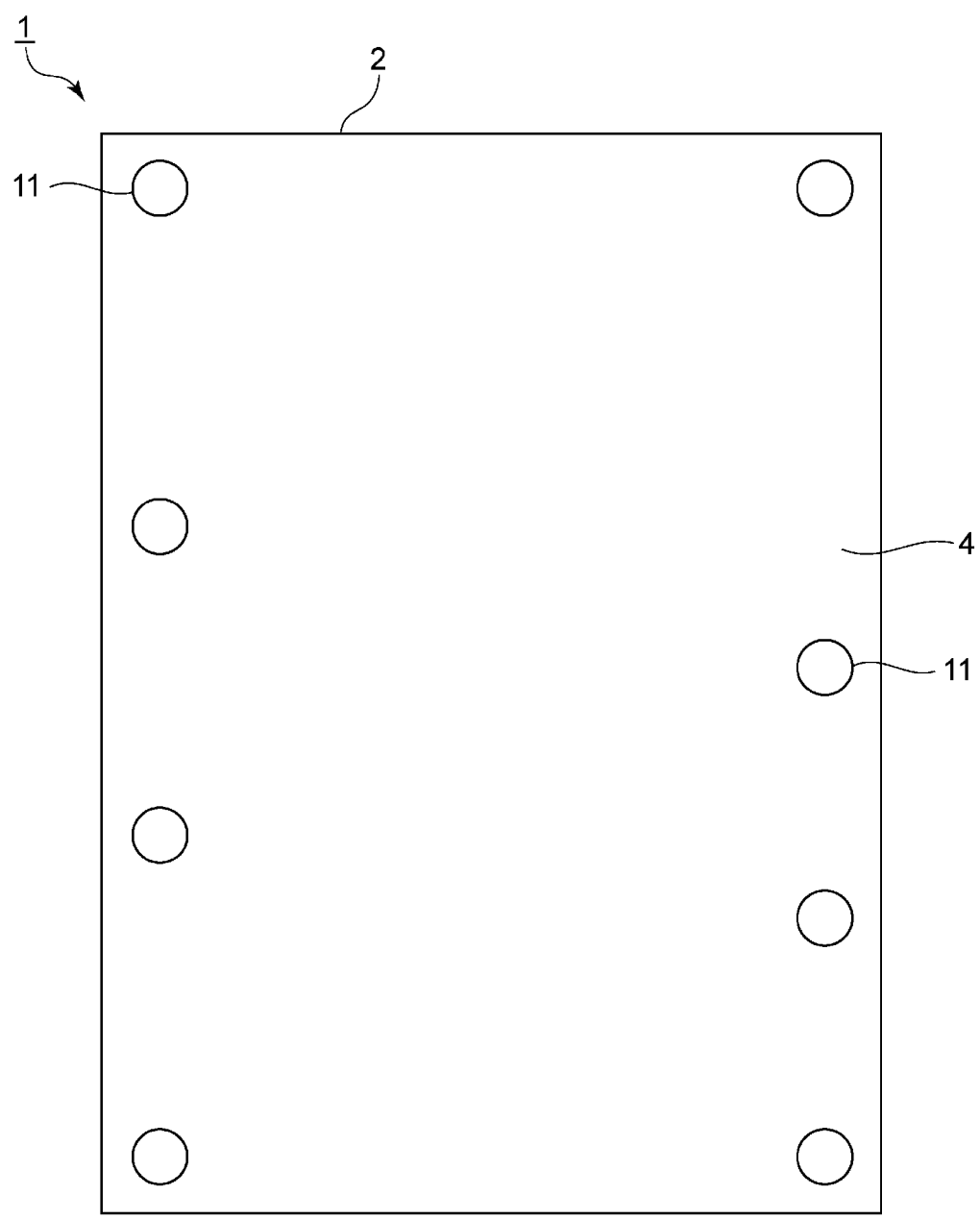
FIG. 1 is a schematic plan view of an elastic wave device according to a first preferred embodiment of the present invention.
Figure 2:
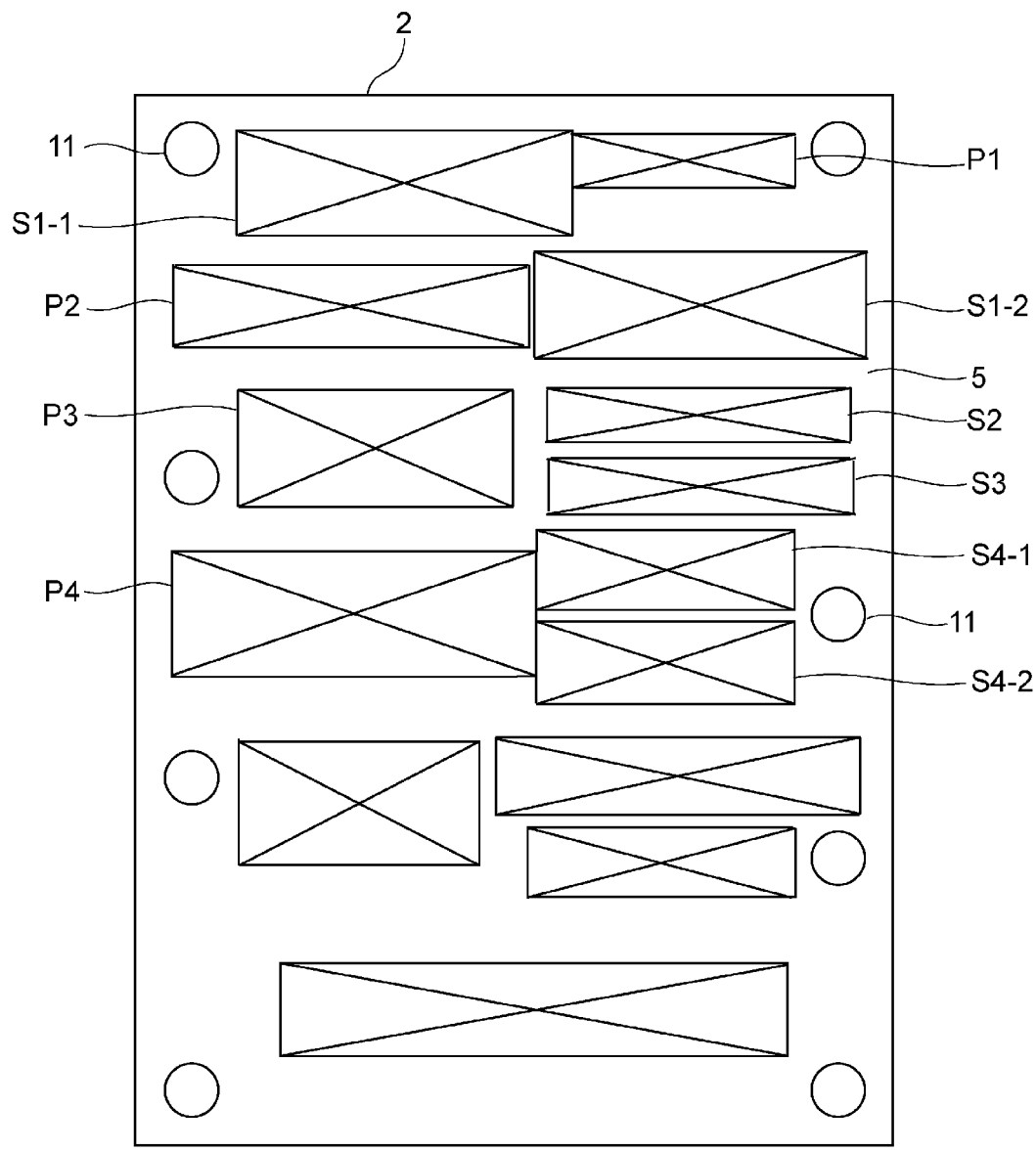
FIG. 2 is a schematic plan view illustrating a structure of the elastic wave device illustrated in FIG. 1 in which a protective film has been removed.
Figure 3:
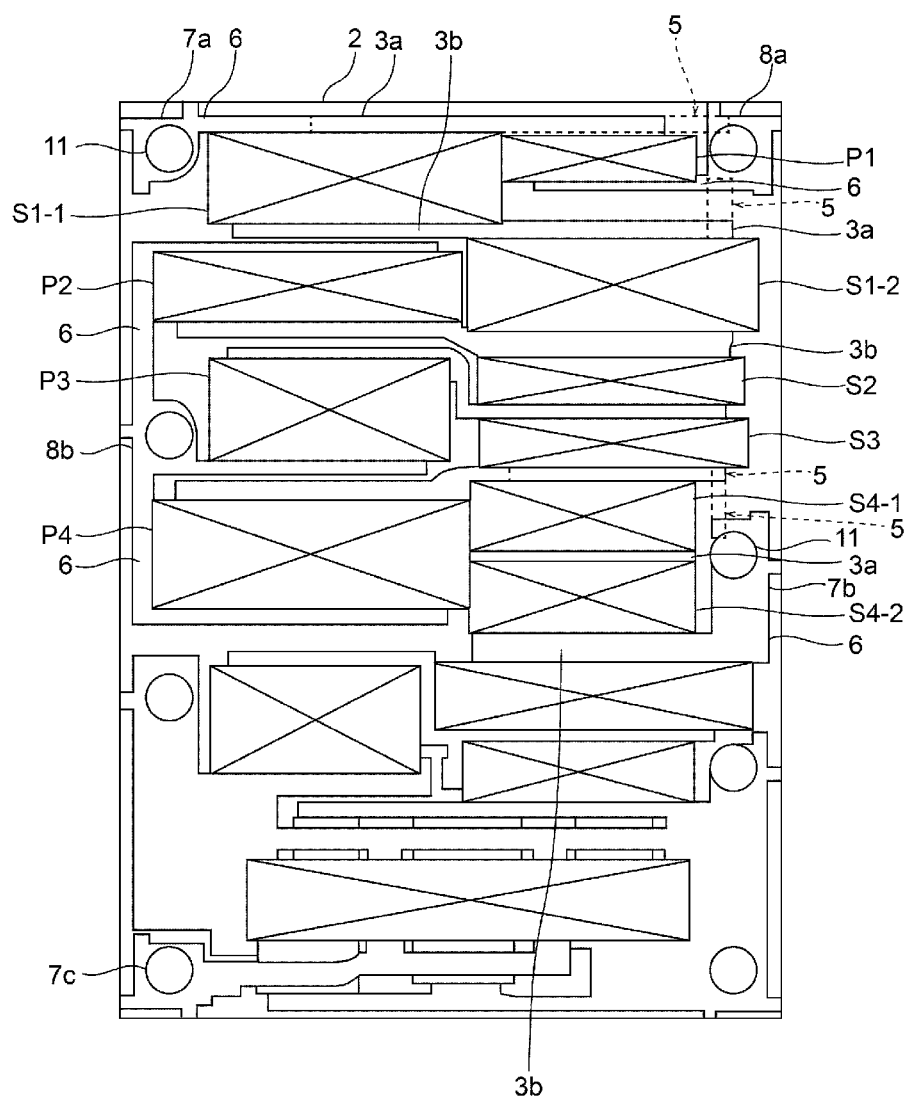
FIG. 3 is a schematic plan view illustrating a structure of the elastic wave device illustrated in FIG. 1 in which the protective film and a heat-conductive material layer have been removed.
Figure 4A:
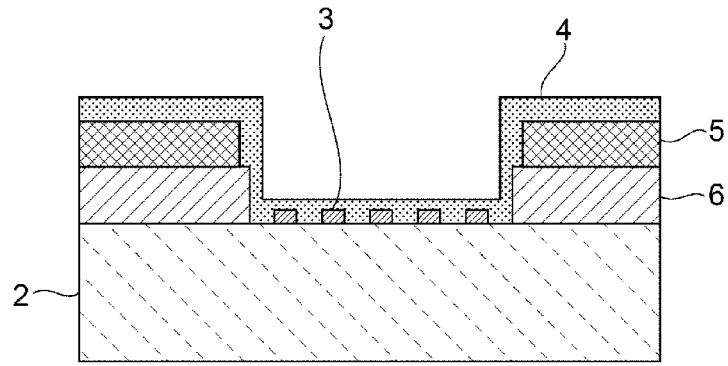
FIG. 4A is a schematic sectional view illustrating a region of the elastic wave device according to the first preferred embodiment of the present invention in which wiring electrodes are disposed.
Figure 4B:
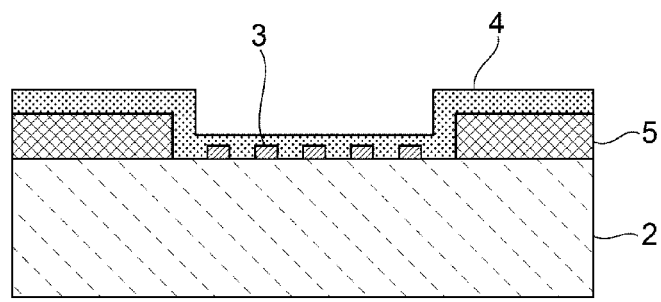
FIG. 4B is a schematic sectional view illustrating a region in which the wiring electrodes are not disposed.

FIG. 1 is a schematic plan view of an elastic wave device according to a first preferred embodiment of the present invention. FIG. 2 is a schematic plan view illustrating a structure of the elastic wave device illustrated in FIG. 1 in which a protective film has been removed. FIG. 3 is a schematic plan view illustrating a structure of the elastic wave device illustrated in FIG. 1 in which the protective film and a heat-conductive material layer have been removed. FIG. 4A is a schematic sectional view illustrating a region of the elastic wave device according to the first preferred embodiment in which wiring electrodes are disposed. FIG. 4B is a schematic sectional view illustrating a region in which the wiring electrodes are not disposed, and FIG. 4C is schematic plan view illustrating the electrode structure of a one-port-type elastic wave resonator.

As illustrated in FIG. 1, an elastic wave device 1 according to a preferred embodiment of the present invention includes a piezoelectric substrate 2 preferably with a rectangular plate shape or a substantially rectangular plate shape. The piezoelectric substrate 2 is preferably made of a piezoelectric single-crystal substrate containing, for example, LiTaO$_3$ or LiNbO$_3$. The piezoelectric substrate 2 may be made of a piezoelectric ceramic.

As illustrated in FIG. 3, a ladder-type filter circuit is provided on the piezoelectric substrate 2. In other words, serial arm resonators S1-1, S1-2, S2, S3, S4-1, and S4-2 and parallel arm resonators P1 to P4, each of which includes an elastic wave resonator, are disposed on the piezoelectric substrate 2. The serial arm resonators S1-1, S1-2, S2, S3, S4-1, and S4-2 and the parallel arm resonators P1 to P4 are each preferably a one-port-type elastic wave resonator, for example.

Figure 4C:
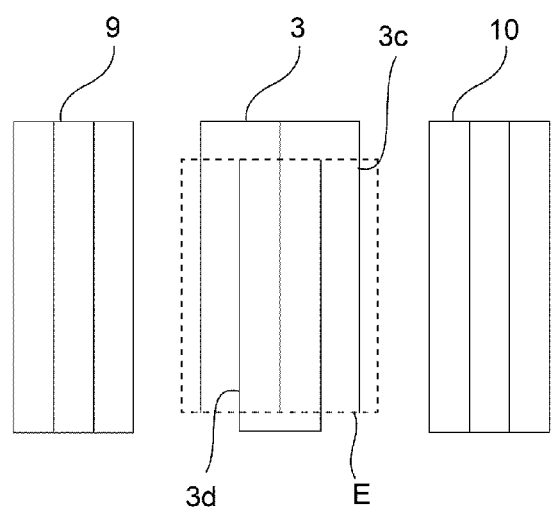
FIG. 4C is schematic plan view illustrating the electrode structure of a one-port-type elastic wave resonator.

Each of the one-port-type elastic wave resonators has the electrode structure illustrated in FIG. 4C. In other words, each of the one-port-type elastic wave resonators includes an IDT electrode 3 and reflectors 9 and 10, which are disposed on either side of the IDT electrode 3 in an elastic wave propagation direction, provided on the piezoelectric substrate.

The IDT electrodes 3 can be made of a suitable metallic material, such as Al, Cu, Pt, Au, Ag, Ti, Ni, Cr, Mo, W, or an alloy having one of these metals as a main material. Each of the IDT electrodes 3 may have a single-layer structure or may be a multilayer body in which two or more types of metal layers are stacked on top of one another.

Each of the IDT electrodes 3 includes a plurality of first electrode fingers 3c and a plurality of second electrode fingers 3d. The plurality of first electrode fingers 3c and the plurality of second electrode fingers 3d extend in a direction perpendicular or substantially perpendicular to the elastic wave propagation direction. The plurality of first electrode fingers 3c and the plurality of second electrode fingers 3d interdigitate with one another. The plurality of first and second electrode fingers 3c and 3d are respectively connected to first and second busbars 3a and 3b, which are illustrated in FIG. 3. A region of each of the IDT electrodes 3 in which the first electrode fingers 3c and the second electrode fingers 3d, which have different potentials, are superposed with one another in the propagation direction of a surface acoustic wave and in which a surface acoustic wave is to be excited will hereinafter be referred to as an excitation region E.

In FIG. 3, portions of the serial arm resonators S1-1, S1-2, S2, S3, S4-1, and S4-2 and the parallel arm resonators P1 to P4 in which the plurality of first electrode fingers and the plurality of second electrode fingers of the corresponding IDT electrodes interdigitate with one another are schematically illustrated by blocks each of which is defined by connecting the diagonal lines of a rectangular or substantially rectangular frame. Regarding the serial arm resonator S1-1, which will be described below as a representative example, the first and second busbars 3a and 3b of the serial arm resonator S1-1 are located on either side of the corresponding block in the direction in which the electrode fingers extend. The second busbar 3b of the serial arm resonator S1-1 is commonly used as the first busbar 3a of the serial arm resonator S1-2. Note that the other serial arm resonators S1-2, S2, S3, S4-1, and S4-2 and the parallel arm resonators P1 to P4 are each illustrated in a similar manner to the serial arm resonator S1-1.

In the present preferred embodiment, the first and second busbars 3a and 3b each have a multilayer structure in which two metal layers are stacked one on top of the other. Naturally, each of the first and second busbars 3a and 3b may have a single-layer structure.

As illustrated in FIG. 3, the serial arm resonators S1-1 and S4-2 are connected to bump electrodes 11, each of which defines a mount electrode. More specifically, the serial arm resonator S1-1 is connected to one of the bump electrodes 11 made of Au or Au alloy via a wiring electrode 6 and a reception terminal 7a, which extend to the corresponding first busbar 3a. In contrast, the serial arm resonator S4-2 is connected to one of the bump electrodes 11 via another wiring electrode 6 and an antenna terminal 7b, which extend to the corresponding second busbar 3b. Note that the mount electrodes may be solder balls. The elastic wave device 1 is mounted on the front surface of a mounting substrate via the bump electrodes 11. A front-surface land electrode that is joined to the bump electrodes 11 is provided on the front surface of the mounting substrate, and a rear-surface land electrode is provided on the rear surface of the mounting substrate. The front-surface land electrode and the rear-surface land electrode are connected to each other with a connecting conductor. Note that it is preferable that the heat capacity of the mounting substrate be larger than the heat capacity of the piezoelectric substrate 2. In addition, it is preferable that the volume of the mounting substrate be larger than the volume of the piezoelectric substrate 2.

The serial arm resonators S1-2, S2, S3, and S4-1 are connected in series between the serial arm resonator S1-1 and the serial arm resonator S4-2. The serial arm resonators S1-2, S2, S3, and S4-1 are not connected to any of the bump electrodes 11 via any of the wiring electrodes 6.

A first end of the parallel arm resonator P1 is connected to a ground terminal 8a, and a second end of the parallel arm resonator P1 is connected to the serial arm resonator S1-1. A first end of the parallel arm resonator P2 is connected to a ground terminal 8b, and a second end of the parallel arm resonator P2 is connected to the serial arm resonators S1-2 and S2. A first end of the parallel arm resonator P3 is connected to the earth terminal 8b, and a second end of the parallel arm resonator P3 is connected to the serial arm resonators S2 and S3. A first end of the parallel arm resonator P4 is connected to the ground terminal 8b, and a second end of the parallel arm resonator P4 is connected to the serial arm resonators S3 and S4-1.

The wiring electrodes 6 can be made of a suitable metal material. In the present preferred embodiment, the wiring electrodes 6 each have a multilayer structure in which two metal layers are stacked one on top of the other. Naturally, each of the wiring electrodes 6 may have a single-layer structure.

As illustrated in FIG. 2, a heat-conductive material layer 5, which is made of a material having an insulating property, is stacked on a region excluding regions located above the first and second electrode fingers of the IDT electrodes of the serial arm resonators S1-1, S1-2, S2, S3, S4-1, and S4-2 and the parallel arm resonators P1 to P4 and regions above the bump electrodes 11.

More specifically, the heat-conductive material layer 5 connects the first and second electrode fingers of the IDT electrodes of the serial arm resonators S1-1, S1-2, S2, S3, S4-1, and S4-2 and the parallel arm resonators P1 to P4 and the bump electrodes 11 to one another.

As a result of providing the heat-conductive material layer 5, heat generated by the IDT electrodes 3 is able to be dissipated from the elastic wave device 1 to the outside. In particular, as in the present preferred embodiment, in the case where the heat-conductive material layer 5 is connected to the bump electrodes 11, the heat-dissipation performance is able to be further improved. This is because the heat generated by the IDT electrodes 3 is transferred to the mounting substrate, onto which the elastic wave device 1 is mounted, via the bump electrodes 11 extending to the heat-conductive material layer 5 and is dissipated from the elastic wave device 1 to the outside.

Therefore, as in the present preferred embodiment, in the case where the heat-conductive material layer 5 connects the serial arm resonators S1-2, S2, S3, and S4-1, which are not connected to the bump electrodes 11, to the bump electrodes 11, the heat-dissipation performance is able to be improved more effectively.

In the present preferred embodiment, as illustrated in FIG. 1, a protective film 4 is provided on the serial arm resonators S1-1, S1-2, S2, S3, S4-1, and S4-2, the parallel arm resonators P1 to P4, and the heat-conductive material layer 5. The protective film 4 is provided to adjust frequency.

The material of the protective film 4 is not particularly limited, and the protective film 4 may be made of $SiO_2$, SiN, or the like.

The material of the heat-conductive material layer 5 is not particularly limited as long as the material is an insulator having a high thermal conductivity, and for example, at least one type of dielectric material selected from the group consisting of alumina, sapphire, aluminum nitride, diamond, and aluminum nitride doped with scandium can be used. Naturally, a material the same as the material of the protective film 4, which is SiN, $SiO_2$, or the like, may be used.

Although the thickness of the heat-conductive material layer 5 is not particularly limited, it is desirable that the thickness of the heat-conductive material layer 5 be larger than the thickness of the protective film 4. More specifically, it is preferable that the thickness of the heat-conductive material layer 5 be about 1 μm to about 60 μm, or more preferably, about 1 μm to about 15 μm, for example. When the thickness of the heat-conductive material layer 5 is within the above-mentioned ranges, the heat-dissipation performance is able to be improved more effectively. It was confirmed in an experiment that a higher heat dissipation effect is obtained when the thickness of the heat-conductive material layer 5 is 1 μm or more. The heat dissipation effect obtained by the heat-conductive material layer 5 is improved by increasing the thickness of the heat-conductive material layer 5. In contrast, in the case of depositing the heat-conductive material layer 5 such that the thickness of the heat-conductive material layer 5 is more than about 60 μm, for example, a problem of warpage of a wafer in a manufacturing process may sometimes become considerable. Thus, it is preferable that the thickness of the heat-conductive material layer 5 be about 60 μm or less because, in this case, warpage of a wafer is able to be further suppressed, and the degree of difficulty of the manufacturing process is able to be reduced. In addition, there may be a case where the thickness of each of the bump electrodes 11 needs to be increased in accordance with the thickness of heat-conductive material layer 5. An increase in induction components due to an increase in the thickness of each of the bump electrodes 11 may sometimes adversely affect the attenuation characteristics of the filter circuit. In order to suppress an adverse effect on the attenuation characteristics with higher certainty, it is further preferable that the thickness of the heat-conductive material layer 5 be within a range of about 1 μm or more and about 15 μm or less, for example.

The positional relationship between the heat-conductive material layer 5 and the wiring electrodes 6 or the protective film 4 on the piezoelectric substrate 2 will now be described in further detail with reference to the schematic sectional views of FIG. 4A and FIG. 4B.

As illustrated in FIG. 4A, in a region in which the wiring electrodes 6 are disposed, the heat-conductive material layer 5 is provided on the wiring electrodes 6, and the protective film 4 is provided on the heat-conductive material layer 5. In a region which is illustrated in FIG. 4B and in which the wiring electrodes 6 are not disposed, the heat-conductive material layer and the protective film 4 are stacked on the piezoelectric substrate 2 in this order.

As illustrated in FIG. 4A and FIG. 4B, the heat-conductive material layer 5 is not provided on the excitation region in which the first and second electrode fingers of the IDT electrode 3 are superposed with one another in the elastic wave propagation direction. When the piezoelectric substrate 2 is viewed in plan, the heat-conductive material layer 5 is located at a position that is not superposed with the excitation region of the IDT electrode 3, and thus, the influence of the heat-conductive material layer 5 upon excitation of the IDT electrode 3 is able to be reduced. It is further preferable that the heat-conductive material layer 5 be provided at a position where the heat-conductive material layer 5 is not superposed with the reflectors when the piezoelectric substrate 2 is viewed in plan. It is preferable that various preferred embodiments of the present invention be implemented with a structure in which the heat-conductive material layer 5 is not provided on the first and second electrode fingers of the IDT electrode 3 and is provided on at least one of the first and second busbars of the IDT electrode 3.

As described above, in the present preferred embodiment, since the heat-conductive material layer 5 is provided on the wiring electrodes 6 or the piezoelectric substrate 2, in the case where heat is generated by the IDT electrodes 3, the heat is able to be dissipated from the elastic wave device 1 to the outside. In particular, the serial arm resonators S1-2, S2, S3, and S4-1, which are not directly connected to the bump electrodes 11, are connected to the bump electrodes 11 via the heat-conductive material layer 5, and thus, heat is able to be dissipated more effectively. In a configuration in which a heat-dissipation path having electrical conductivity is disposed in the vicinity of one of the IDT electrodes, the heat-dissipation path defines and functions as a wiring electrode. In this case, there is a problem in that a capacitance component or an induction component is generated between the wiring electrode and the IDT electrode 3. In contrast, in the present preferred embodiment, since a heat-dissipation path has an insulating property, a capacitance component or an induction component that is generated between the heat-dissipation path and one of the IDT electrodes 3 is able to be reduced. Furthermore, since the heat-conductive material layer 5 is not provided on the first and second electrode fingers of the IDT electrodes 3, it is less likely that deterioration in the electrical characteristics, such as deterioration in the resonator characteristics as a result of excitation of a surface acoustic wave being obstructed, will occur. It is preferable that the heat-conductive material layer 5 be continuously provided so as to be connected to the first busbars of the IDT electrodes 3 and the mount electrodes. Even in the case where there is a potential difference between the first busbars and the bump electrodes, a short circuit will not occur in the heat-conductive material layer 5, which has an insulating property. More specifically, in the case where the heat-conductive material layer 5 is connected to the first busbars, each of which is connected to a signal line path, and the bump electrodes, each of which is connected to a ground potential, a short circuit will not occur between the first busbars and the bump electrodes. Thus, heat is able to be dissipated by connecting the heat-conductive material layer 5 to the first busbars and the bump electrodes without any concern of a short circuit. In particular, it is preferable that the heat-conductive material layer 5 be connected to the first busbars and one of the bump electrodes, the bump electrode being closest to the first busbars and having a potential different from those of the first busbars. There may be a plurality of bump electrodes each having a potential different from those of the first busbars. It is preferable that the heat-conductive material layer 5 be provided at only positions that are superposed with the first and second busbars, positions that are superposed with the wiring electrodes, and positions that are superposed with portions of the piezoelectric substrate, the portions being located in the gaps between the wiring electrodes, when the piezoelectric substrate is viewed in plan. It is further preferable that the heat-conductive material layer 5 be provided in direct contact with the first and second busbars and the wiring electrodes.

Figure 5A:
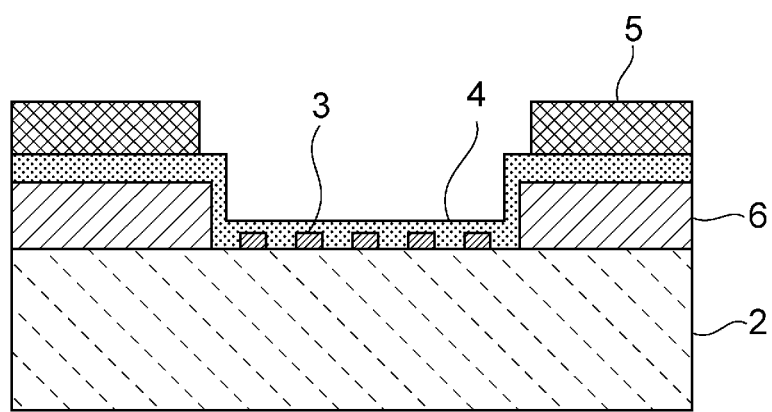
FIG. 5A is a schematic sectional view illustrating a region of an elastic wave device according to a second preferred embodiment of the present invention in which wiring electrodes are disposed.
Figure 5B:
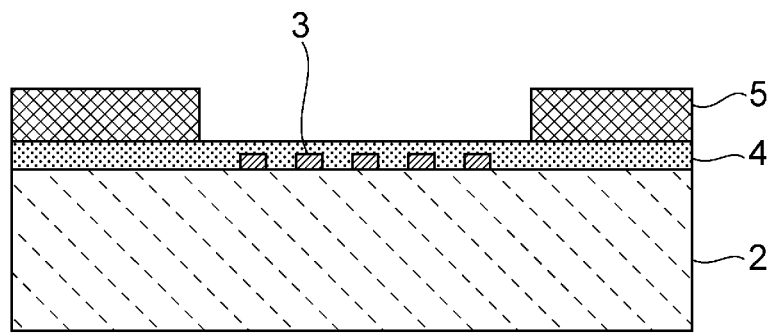
FIG. 5B is a schematic sectional view illustrating a region in which the wiring electrodes are not disposed.

FIG. 5A is a schematic sectional view illustrating a region of an elastic wave device according to a second preferred embodiment of the present invention in which wiring electrodes are disposed, and FIG. 5B is a schematic sectional view illustrating a region in which the wiring electrodes are not disposed.

As illustrated in FIG. 5A, in the second preferred embodiment, the wiring electrodes 6 and the protective film 4 are stacked on the piezoelectric substrate 2 in this order, and the heat-conductive material layer 5 is provided on the protective film 4. As illustrated in FIG. 5B, also in a region in which the wiring electrodes 6 are not disposed, the protective film 4 and the heat-conductive material layer 5 are stacked on the piezoelectric substrate 2 in this order. The rest of the structure of the elastic wave device is the same as the structure of the elastic wave device 1 according to the first preferred embodiment.

In the second preferred embodiment, the heat-conductive material layer 5 is not directly stacked on the wiring electrodes 6. However, since the heat-conductive material layer 5 is provided on the protective film 4, heat is able to be dissipated via the protective film 4 and the heat-conductive material layer 5. In addition, similar to the first preferred embodiment, the heat-conductive material layer 5 is not provided on the first and second electrode fingers of the IDT electrodes 3, and thus, it is less likely that deterioration in the electrical characteristics, such as the resonator characteristics, will occur. Thus, the heat-conductive material layer 5 may be provided on the protective film 4 excluding portions of the protective film 4 located on the first and second electrode fingers of the IDT electrodes 3. In order to obtain a sufficient heat dissipation effect, it is preferable that the heat-conductive material layer 5 have a thermal conductivity equal to or higher than that of the protective film 4, or more preferably, a thermal conductivity higher than that of the protective film 4. The material used for the heat-conductive material layer 5 can change the thermal conductivity of the heat-conductive material layer 5.

Figure 6A:
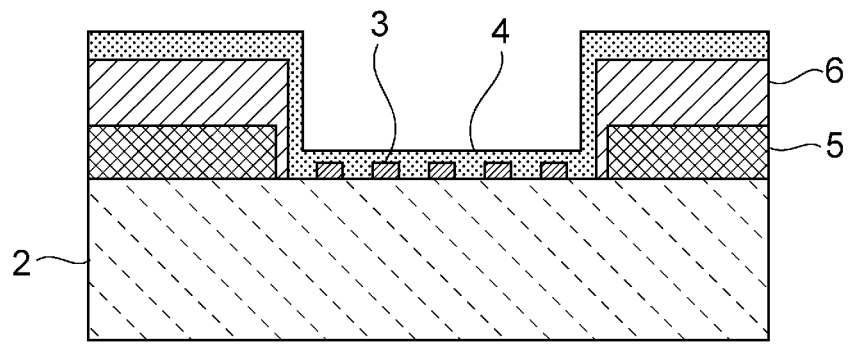
FIG. 6A is a schematic sectional view illustrating a region of an elastic wave device according to a third preferred embodiment of the present invention in which wiring electrodes are disposed.
Figure 6B:
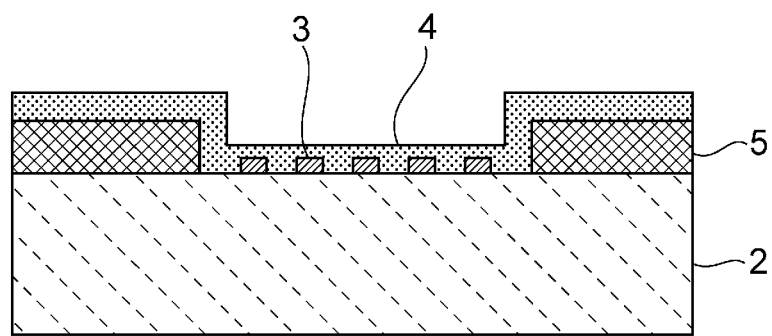
FIG. 6B is a schematic sectional view illustrating a region in which the wiring electrodes are not disposed.

FIG. 6A is a schematic sectional view illustrating a region of an elastic wave device according to a third preferred embodiment of the present invention in which wiring electrodes are disposed, and FIG. 6B is a schematic sectional view illustrating a region in which the wiring electrodes are not disposed.

As illustrated in FIG. 6A, in the third preferred embodiment, the heat-conductive material layer 5, the wiring electrodes 6, and the protective film 4 are stacked on the piezoelectric substrate 2 in this order. In other words, in the third preferred embodiment, the heat-conductive material layer 5 is preferably interposed between the piezoelectric substrate 2 and the wiring electrodes 6. In addition, although not illustrated in FIG. 6A and FIG. 6B, the heat-conductive material layer 5 is also provided below the first and second busbars of the IDT electrodes 3. The rest of the structure of the elastic wave device according to the third preferred embodiment is the same as the structure of the elastic wave device 1 according to the first preferred embodiment.

In the third preferred embodiment, since the heat-conductive material layer 5 is in contact with lower portions of the wiring electrodes 6, heat generated by the IDT electrodes 3 is transferred to the heat-conductive material layer 5 and is dissipated from the elastic wave device 1 to the outside. Specifically, heat generated as a result of excitation of the IDT electrodes 3 disposed on the piezoelectric substrate 2 is transferred to the mounting substrate via the wiring electrodes 6 and the bump electrodes 11. Note that the heat-conductive material layer 5 may be interposed between the piezoelectric substrate 2 and the wiring electrodes 6.

Note that although not illustrated in FIG. 4 to FIG. 6, according to a preferred embodiment of the present invention, the heat-conductive material layer 5 may be adjacent to the first and second busbars of the IDT electrodes 3, the reflectors, or the wiring electrodes 6 when viewed from the direction toward a main surface of the piezoelectric substrate 2. Also in this case, heat generated by the IDT electrodes 3 is able to be dissipated via the heat-conductive material layer 5.

According to various preferred embodiments of the present invention, as described above, the heat-conductive material layer preferably is defined at least partially by a region excluding the excitation regions of the IDT electrodes and the regions located above the bump electrodes, and thus, elastic wave devices having high heat-dissipation performance and favorable electric power handling capability are provided. In addition, in the elastic wave devices according to various preferred embodiments of the present invention, since the heat-conductive material layer is not provided on the first and second electrode fingers of the IDT electrodes, the electrical characteristics, such as the resonator characteristics, are less likely to deteriorate. The heat-conductive material layer is provided on none of the first and second electrode fingers and conductors of the bump electrodes.

According to various preferred embodiments of the present invention, in the ladder-type filter circuit, the heat-dissipation performance is able to be improved more effectively by connecting the serial arm resonators, which are not connected to the bump electrodes, to the bump electrodes via the heat-conductive material layer as described above. Therefore, elastic wave devices according to various preferred embodiments of the present invention can preferably be used as a transmission filter of a duplexer.

A non-limiting specific experimental example will be described below.

Experimental Example

Under the following conditions, a duplexer including a transmission filter and a reception filter disposed on a $LiTaO_3$ substrate was fabricated, and a maximum temperature of an IDT electrode was measured.

IDT electrode: having Al as a main material and a thickness of 200 nm

Protective film: formed of $SiO_2$ and having a thickness of 30 nm

Wiring electrode: having Al as a main material and a thickness of 3 μm

Heat-conductive material layer: formed of SiN

Thickness of heat-conductive material layer: 1 μm on a wiring electrode and 4 μm on a piezoelectric substrate where the wiring electrode was not disposed Heat-conductive material layer pattern: formed in portion excluding electrode fingers of the IDT electrode and a bump electrode Piezoelectric substrate was mounted via the bump electrode on a mounting substrate in which a PCB substrate was used Power of 0.8 W was supplied to a transmission filter resonator Outside temperature: 25° C.

Note that a sample that was not provided with a heat-conductive material layer was also fabricated under conditions similar to the above, and comparative studies were conducted.

It was confirmed that the maximum temperature of the IDT electrode of a serial arm resonator, which was not connected to the bump electrode, in the sample that was provided with the heat-conductive material layer was lower than that in the sample that was not provided with a heat-conductive material layer by about 10° C.

It is assumed that, in the case where a heat-conductive material layer is not provided, heat dissipation is not effectively performed because the serial arm resonator is not connected to the bump electrode via a wiring line, and conversely, in the case where a heat-conductive material layer is provided, heat dissipation is effectively performed because the heat-conductive material layer defines and functions as a heat path to the bump electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
an interdigital transducer (IDT) electrode on the piezoelectric substrate and including first and second busbars and first and second electrode fingers connected to the first and second busbars;
a mount electrode electrically connected to the IDT electrode;
a protective film covering the IDT electrode;
a heat-conductive material layer that has an insulating property and that is provided only in a region excluding an excitation region of any IDT electrode and a region located above the mount electrode; and
a wiring electrode that connects at least one of the first and second busbars of the IDT electrode to the mount electrode; wherein
a ladder-type filter circuit is provided;
a serial arm resonator of the ladder-type filter circuit is connected to the mount electrode via the heat-conductive material layer;
the heat-conductive material layer is in contact with at least a portion of the wiring electrode; and
the heat-conductive material layer is stacked on the wiring electrode.

2. The elastic wave device according to claim 1, wherein the wiring electrode has a multilayer structure in which two metal layers are stacked one on top of another.

3. The elastic wave device according to claim 1, wherein the heat-conductive material layer is adjacent to the wiring electrode.

4. The elastic wave device according to claim 1, wherein the heat-conductive material layer is connected to the mount electrode.

5. The elastic wave device according to claim 1, wherein the heat-conductive material layer has a thickness larger than a thickness of the protective film.

6. The elastic wave device according to claim 1, wherein the protective film includes at least one of $SiO_2$ and SiN.

7. The elastic wave device according to claim 1, wherein the heat-conductive material layer includes at least one type of dielectric material selected from a group consisting of alumina, sapphire, aluminum nitride, diamond, aluminum nitride doped with scandium, SiO₂, and SiN.

8. The elastic wave device according to claim 1, wherein serial arm resonators including the serial arm resonator of the ladder-type filter circuit that is connected to the mount electrode via the heat-conductive material layer and parallel arm resonators of the ladder-type filter circuit are disposed on the piezoelectric substrate.

9. The elastic wave device according to claim 8, wherein each of the serial arm resonators and the parallel arm resonators is defined by a one-port resonator.

10. The elastic wave device according to claim 1, wherein wiring electrodes and the protective film are stacked on the piezoelectric substrate in this order, and the heat-conductive material layer is provided on the protective film.

11. The elastic wave device according to claim 10, wherein in a region in which the wiring electrodes are not disposed, the protective film and the heat-conductive material layer are stacked on the piezoelectric substrate in this order.

12. The elastic wave device according to claim 1, wherein the heat-conductive material layer is provided on none of the first and second electrode fingers and conductors defining the mount electrode.

13. A transmission filter of a duplexer comprising the elastic wave device according to claim 1.

14. An elastic wave device comprising:
a piezoelectric substrate;
an interdigital transducer (IDT) electrode on the piezoelectric substrate and including first and second busbars and first and second electrode fingers connected to the first and second busbars;
a mount electrode electrically connected to the IDT electrode;
a protective film covering the IDT electrode; and
a heat-conductive material layer that has an insulating property and that is provided only in a region excluding an excitation region of any IDT electrode and a region located above the mount electrode; wherein
a ladder-type filter circuit is provided;
a serial arm resonator of the ladder-type filter circuit is connected to the mount electrode via the heat-conductive material layer; and
the heat-conductive material layer, wiring electrodes, and the protective film are stacked on the piezoelectric substrate in this order.

* * * * *